United States Patent [19]
Saif et al.

[11] Patent Number: 5,862,003
[45] Date of Patent: Jan. 19, 1999

[54] MICROMOTION AMPLIFIER

[76] Inventors: Muhammad T. A. Saif, J-1, 301 Maple Ave.; Trent Huang, Phillips Hall, Cornell University; Noel C. MacDonald, 515 Highland Rd., all of Ithaca, N.Y. 14850

[21] Appl. No.: 667,880

[22] Filed: Jun. 20, 1996

Related U.S. Application Data

[60] Provisional application No. 60/000,438 Jun. 23, 1995.

[51] Int. Cl.$^6$ .......................... G02B 7/182; G02B 26/08; G02B 26/00; G02B 5/08
[52] U.S. Cl. .......................... 359/871; 359/223; 359/224; 359/225; 359/226; 359/291; 359/292; 359/872; 359/847; 359/846
[58] Field of Search .................................... 359/871, 223, 359/224, 225, 226, 291, 292, 847, 846, 849, 855

[56] References Cited

U.S. PATENT DOCUMENTS

| | | | |
|---|---|---|---|
| 1,910,119 | 5/1933 | Moats | 359/847 |
| 4,919,500 | 4/1990 | Paulsen | 359/224 |
| 5,005,298 | 4/1991 | Nagasawa et al. | 33/573 |
| 5,179,499 | 1/1993 | MacDonald et al. | 437/203 |
| 5,198,390 | 3/1993 | MacDonald et al. | 437/203 |
| 5,235,187 | 8/1993 | Arney et al. | 250/306 |
| 5,316,979 | 5/1994 | MacDonald et al. | 437/203 |
| 5,375,033 | 12/1994 | MacDonald | 437/203 |

FOREIGN PATENT DOCUMENTS 40 00 496 A1  2/1991  Germany.

OTHER PUBLICATIONS

Ulf Lindbergt, et al., "Quasi–buckling of Micromachined Beams", Micromech, Microeng. 3 (1993), pp. 183–186.
Reid A. Brenne, et al., "Large Displacement Linear Actuator", IEEE, CH2783–9/90, 1990, pp. 135–139.
Savoia et al., "Post–buckling Behavior of Stiffened Cross–Ply Cylindrical Shells", J. of Applied Mechanics, Dec. 1994, vol. 61, pp. 998–1000.
Haengsoo Lee, et al., "Finite Element Analysis of Lateral Buckling for Beam Structures", Computers and Structures, 1994, vol. 53, No. 6 pp.1357–1371.
Stephen P. Timoshenko, et al., "Theory of Elastic Stability", Eng. Societies Monographs, 1961, pp. 46–83.

Primary Examiner—Cassandra C. Spyrou
Assistant Examiner—Mohammad Y. Sikder
Attorney, Agent, or Firm—Jones, Tullar & Cooper, P.C.

[57] ABSTRACT

A microelectromechanical micromotion amplifier generates a controlled lateral motion in response to a small deformation in the axial direction of a MEM beam or body. Lateral motion is produced by buckling of one or more long slender beams, the buckling motion being relatively large with respect to the axial motion which causes such lateral motion. The beams may be designed with a slight asymmetry to achieve gradual buckling in a desired direction. The device is capable of amplifying a driving motion in the range of 1–5 micrometers to produce a transverse motion in the range of 50–200 micrometers.

18 Claims, 15 Drawing Sheets

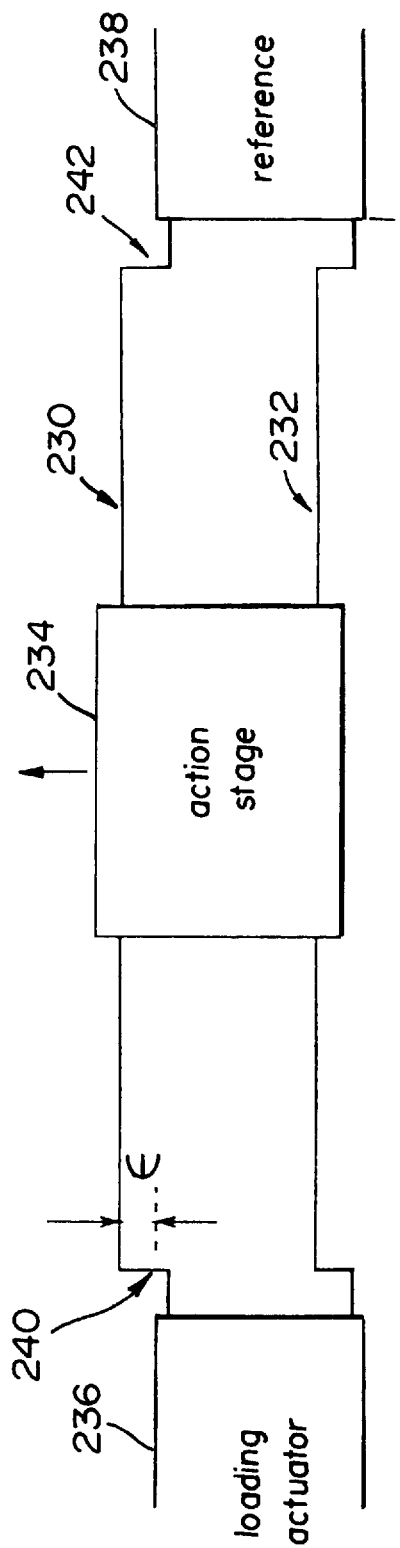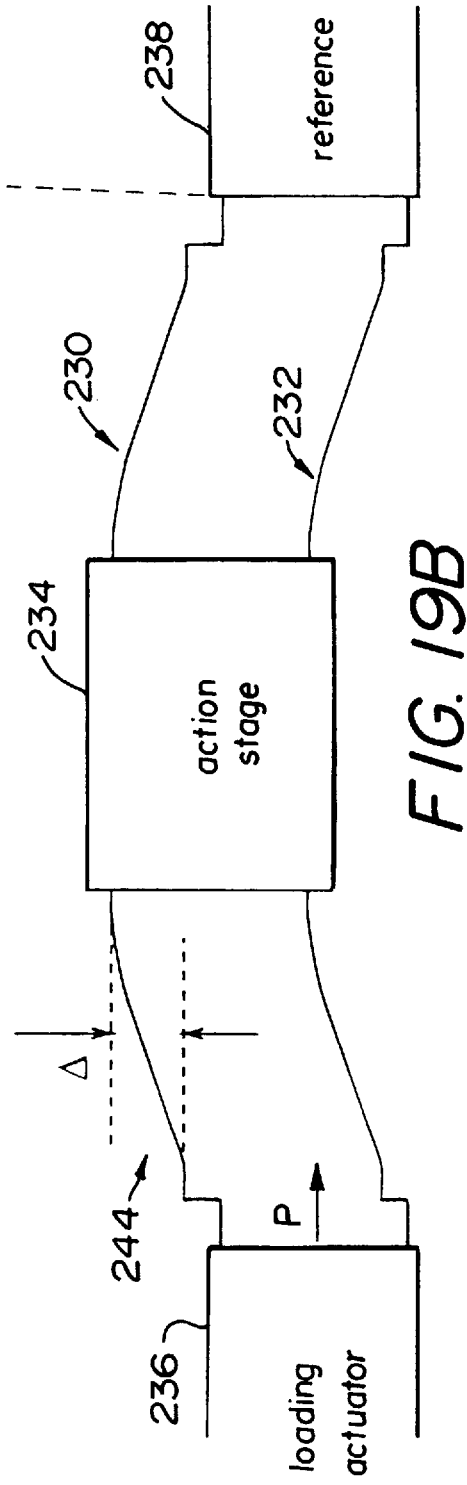

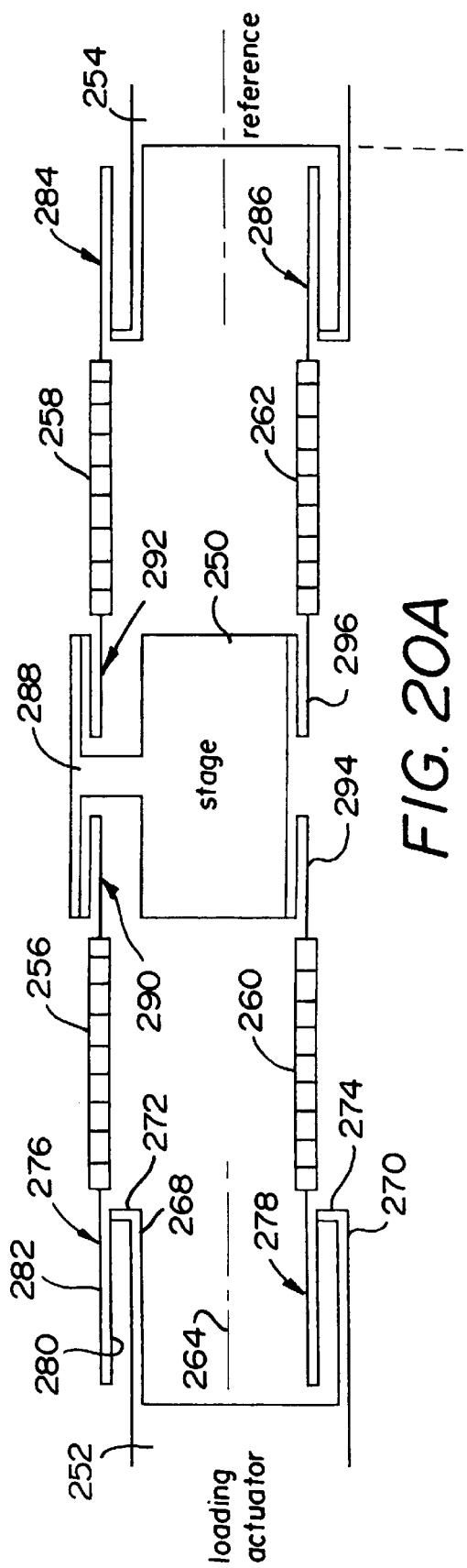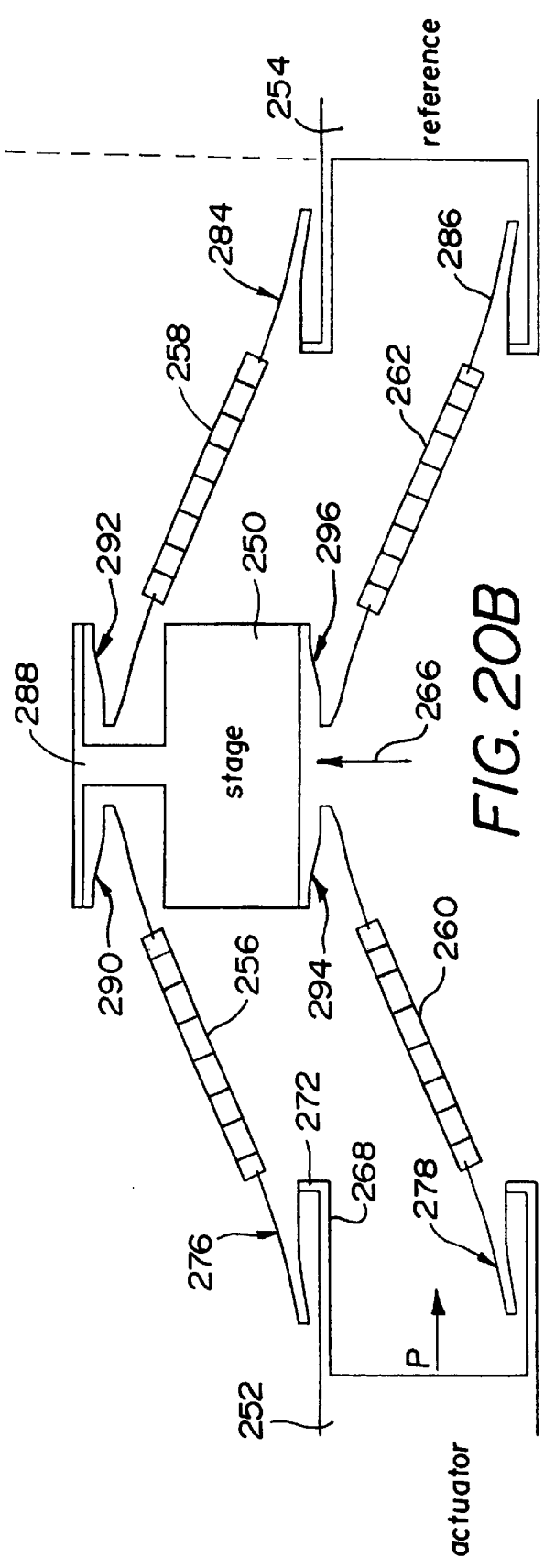

MICROMOTION AMPLIFIER

This application claims the benefit of U.S. Provisional application Ser. No. 60/000,437, filed Jun. 23, 1995, the disclosure of which is hereby incorporated herein by reference.

BACKGROUND OF THE INVENTION

The present invention relates, in general, to microelectromechanical motion (MEM) amplifiers, and more particularly to microelectromechanical structures wherein a small driving motion in an axial direction applied to a structure produces a relatively large motion in a direction transverse to the axial drive motion, thereby amplifying the drive motion, the structure of the invention providing an amplification of about two orders of magnitude.

In micromechanical systems, for example of the type illustrated in U.S. Pat. No. 5,506,175 to Zhang and MacDonald, motion of a rigid MEM body is typically obtained by attaching that body to an actuator which is then activated to generate the motion.

The actuator may include a fixed portion and a relatively movable portion supported by a set of springs formed from released structural beams, with motion of the movable part of the actuator deforming the springs. The force required to deform the springs and thus move the actuator may be obtained, for example, by the use of parallel plate or comb capacitors actuators, by differential heating of actuators, or by other controllable force generators.

In spring-supported devices, the resisting force of the supporting springs varies linearly with deformation as long as the deformation is small; however, for larger deformations, the force required to move the spring varies nonlinearly, primarily as the cube of the deformation, with the nonlinear terms of the spring restoring force becoming dominant. Thus, the applied force generated by the actuator has to be increased nonlinearly for large increments of deformation, and this requires prohibitively large voltages for electrical actuators such as capacitors. Furthermore, if the actuator is a parallel plate capacitor, the available motion is limited by the gap between the parallel plates, while if the actuator is a comb capacitor, large motion involves a large overlap between the combs which, together with the high voltage required, may produce an unstable actuation. These factors have limited the maximum available controlled deformation of such micromechanical devices to only several micrometers.

SUMMARY OF THE INVENTION

In order to meet the long felt need for a controllable large range of motion in micromechanical systems for use in a wide variety of applications such as data storage, optics, microrobotics, and the like, the present invention provides a novel technique for generating controllable, amplified motion on the order of 50–200 micrometers. This wide range of motion is obtained by a mechanical amplification of conventional MEM actuator motion through the technique of buckling long slender beams. The beams may be unitary flexible beams or may be segmented rigid beams which produce transverse motion in response to applied axial forces. The transverse displacement of a buckled beam can be two orders of magnitude higher than the relative axial displacement of its ends which causes the buckling.

The transverse displacement of a buckled beam in response to an applied axial force can be used, in accordance with the invention, to move a micronscale object such as an emitter tip, a sensor tip or the like, or to move larger objects such as a stage for supporting multiple tips, mirrors, or the like, in a controllable fashion. Such an object is fabricated, or is placed, on the mid-region of beams which are to be buckled, so that when the actuator displaces the ends of the beam axially to cause the transverse buckling described above, the object is controllably moved.

In accordance with a preferred form of the invention, a long, slender, flexible, released beam is fabricated using the SCREAM processes described in U.S. Pat. No. 5,198,390 and in U.S. patent application Ser. No. 08/312,797, filed Sep. 27, 1994, now U.S. Pat. No. 5,719,073, of Kevin A. Shaw et al., the disclosures of which is hereby incorporated herein by reference. Although the SCREAM process is preferred, other processes such as the polysilicon process can be used to fabricate the beam and actuator structure. The beam is fabricated to incorporate at its center point an object to be moved, such as a tip or, if desired, a stage on which such tips are mounted or fabricated. The ends of the beam are axially movable toward each other by axial forces to produce buckling. Although both ends may be movable, it is preferred that one end of the beam be fixed and the opposite end be mounted on, or fabricated as a part of, an actuator capable of controlled motion along the axis of the beam for applying an axial compressive force to it. When such a force is applied to a long, slender flexible beam, the beam buckles in a transverse direction as the load exceeds a critical value. Where the beam is flexible and continuous, the peak transverse deformation $\Delta$ of the buckled or bowed beam is approximately proportional to $$\sqrt{L\delta} \qquad \text{(Eq. 1)}$$

where L is the length of the beam and $\delta$ is the axial end displacement due to motion of the actuator. For a beam with both ends clamped, that is, with both ends secured to a fixed structure or to an actuator for controlled motion, then $$\Delta \approx 2\sqrt{LS}/\pi \qquad \text{(Eq. 2)}$$

Thus, for a beam having a length equal to 5 millimeters and an applied, or end, axial displacement $\delta$ of 5 micrometers, the transverse deformation $\Delta$ may approximate 100 micrometers for some designs, and can approach double that amount by proper design. Furthermore, by varying the design, the beam can be made to buckle in-plane or out-of-plane, thus enabling large amplified motion in a selected direction.

The axial compressive force and the required end displacement $\delta$ can be achieved, in accordance with the invention, by micromechanical actuators such as parallel plate or comb capacitor actuators of the type illustrated, for example, in U.S. Pat. No. 5,506,175, described above. Since the amount of force required to initially buckle a continuous flexible beam varies as the inverse square of the length of the beam, the force is very small for long, slender beams. Further, after initial buckling, the slender beam will bow or flex transversely a large distance with very little additional force being needed, for the beam will have very little additional resistance to such motion.

The motion of the actuator must be accommodated by similar motion of the support springs, but since the deformation $\delta$ is small, the spring restoring force is linear. As a result, only a small additional driving force needs to be generated by the actuator to deform the springs which support the actuator. Consequently, a relatively small actuating force and thus a relatively small operating voltage is needed to cause the ends of the buckling beam to approach each other and to thereby produce the amplified transverse motion at the center of the beam. The transverse motion in response to the axial force is gradual, smooth, and continuous.

In a preferred form of the invention, the beams are designed with a slight asymmetry to achieve gradual buckling in the desired direction. Such asymmetry can be obtained, for example, by designing small perturbations in the beams so that buckling in one direction or another is energetically more favorable. One such asymmetry may be the provision of a segmented beam having flexible hinge-like joints at desired locations along the length of the slender beam so as to initiate buckling at predetermined locations under predetermined axial forces.

Beams suitable for the present invention and fabricated by the SCREAM (Single Crystal Reactive Etching and Metallization) process described above may be, for example, 12 micrometers deep, 1 or 2 micrometers wide, with a length of, for example, between 3 and 5 millimeters. A released beam constructed by the SCREAM process may be coated with silicon dioxide and aluminum and is highly planar. An actuator utilizing a comb capacitor in accordance with the present invention may generate an axial force as high as 1.0 mN to produce an end displacement $\delta$ along the axis of the beam of between about 1 and about 5 micrometers. Such actuating capacitors can also be used to sense the axial displacement by detecting the change of total capacitance, with this measurement being available to provide a feedback control of the end motion and thus of the amplified transverse motion of the beam.

The foregoing structure provides a highly stable and highly controllable micromotion amplifier which provides a large driven displacement of an object or stage carried by one or more beams with only a small driving displacement. The driven, or transverse, motion is controllable and repeatable to provide precise controlled, amplified movement of an object mounted on the beam. The design is fully compatible with MEM technology and has a wide range of applications, such as the provision of a mirror surface on a movable stage to provide highly controllable optical scanning of light beams. Alternatively, the movable stage may incorporate nanometer-scale tips such as those carried by the movable stage in the aforesaid Pat. No. 5,506,175 for use, for example, in atomic resolution surface analysis utilizing scanning tip microscopy and/or atomic force microscopy. The large motion and precise position control available with the present structure permits study of the mechanical properties of relatively large biological members such as protein molecules and DNA molecules. Further, mechanical structures such as microgrippers on a movable stage may provide precision transport of micron scale materials Other applications and uses of the amplifier of the present invention will be recognized by those of skill in the art.

BRIEF DESCRIPTION OF THE DRAWINGS

The foregoing, and additional objects, features and advantages of the present invention will become apparent from a consideration of the following detailed description of preferred embodiments thereof, taken in conjunction with the accompanying drawing, in which:

FIGS. 19A and 19B illustrate in diagrammatic form asymmetric beams carrying a stage and the motion amplification of such a stage;

FIGS. 20A and 20B illustrate in diagrammatic form a stage supported by four segmented beams connected to an actuator and a stage by way of spring hinges;

DESCRIPTION OF PREFERRED EMBODIMENTS

Figure 1:
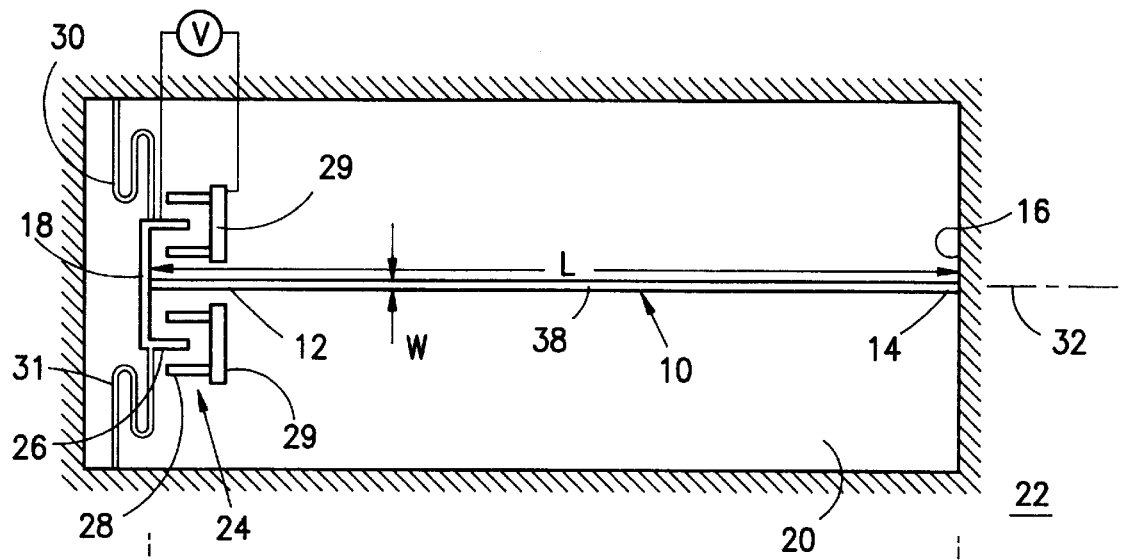
FIGS. 1, 2 and 3 illustrate in diagrammatic form the transverse buckling response of a long slender beam to an axial compressive force.

Turning now to a more detailed consideration of the present invention, there is illustrated in FIG. 1 a long slender, flexible beam 10 which is clamped at one of its ends 12 and 14 to at least one drive actuator. In the illustrated embodiment, end 14 is secured to a fixed reference such as a surface 16, while end 12 is secured to a drive actuator such as movable actuator element 18. The beam 10 preferably is an elongated, thin, flexible microelectromechanical (MEM) structure fabricated, for example, from single crystal silicon utilizing the SCREAM process described above. The beam 10 may have a length L of, for example, 3–5 millimeters, or more, may have a transverse width W of 1 or 2 micrometers and may have a depth, perpendicular to the plane of FIG. 1, of about 12 micrometers. This cross-sectional shape provides a beam that has a high aspect ratio so that it is transversely flexible, and is relatively inflexible in the perpendicular direction.

The beam 10 may be fabricated in a cavity or trench 20 formed in a substrate or wafer 22, with the end 14 of the beam being unitary with surface 16 which may be, for example, a wall of the cavity 20 in which the beam is located. In similar manner, the end 12 of the beam 10 may be unitary with element 18 which preferably is part of an actuator fabricated simultaneously with the fabrication of beam 10, and which may be, for example, the movable part of a comb-type actuator 24 having interleaved movable and stationary fingers 26 and 28, respectively. As illustrated, the stationary fingers 28 may be fabricated as part of fixed supports 29 extending from the floor of cavity 20. The beam 10 originates at wall 16 at end 14, and is released for motion with respect to the substrate or wafer from which the device is fabricated, in the manner described, for example, in the aforesaid Pat. No. 5,198,390, with the end 12 being held by actuator 24. If desired, the movable element 18 may be supported by lateral spring arms 30 and 31 extending to the cavity wall.

Energization of the actuator 24, as by application of a suitable voltage V across the opposed capacitor finger plates 26 and 28 of actuator 24 to cause the plates to tend to move closer together will apply a force P (FIG. 2) to the end 12 of beam 10, with the force being applied along the longitudinal axis 32 of the beam. This axial force tends to compress the beam, but as long as $$P \leq P_{cr} = 4\pi^2 \, EI/L^2 \tag{Eq.3}$$

the beam remains straight. In the foregoing equation, P is the force applied, $P_{cr}$ is the buckling load for the beam, E is the modulus of elasticity of the material of the beam, and I is the lowest moment of inertia of the beam cross section. As $P > P_{cr}$, the beam will buckle transversely, either upwardly in the direction 34 as viewed in FIG. 2, or downwardly in the direction 36 as viewed in FIG. 3. The maximum transverse deformation occurs in the mid region 38. If the beam is symmetrical, either of the two displacements are possible, with both of these directions being perpendicular to the depth dimension of the beam since, as discussed above, that dimension is greater than the beam width to provide greater flexibility for the beam in those directions.

Figure 2:
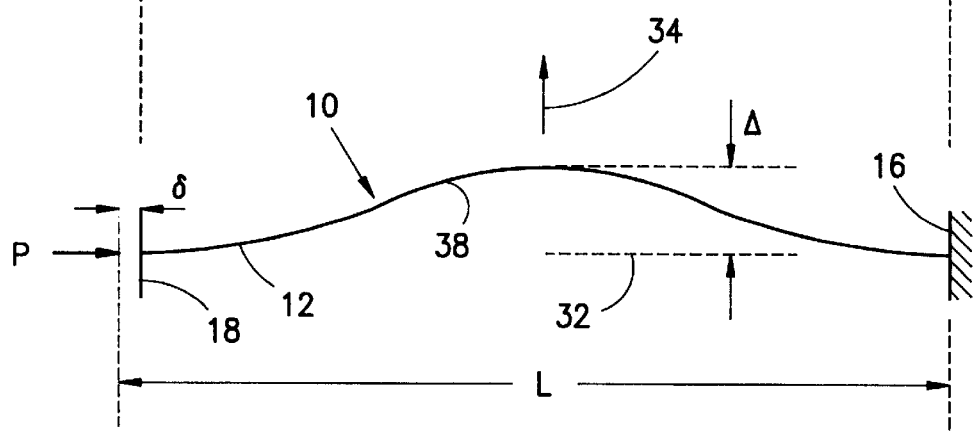
Figure 3:
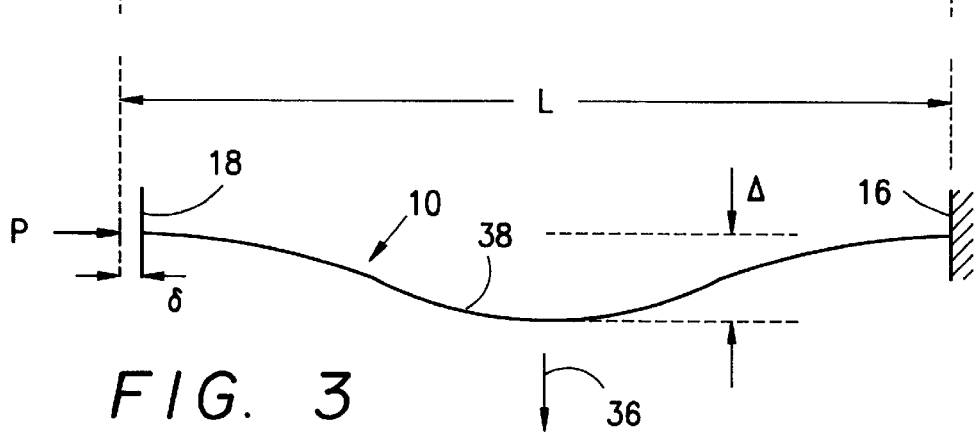

As illustrated in FIGS. 2 and 3, the force P applied by the actuator 24 causes the ends 12 and 14 of the beam to approach each other by a distance δ after the beam buckles. This axial motion causes a corresponding transverse deformation Δ which is defined by Equation 2, above. When L is large, this transverse deformation Δ is very large in comparison to the value of the axial compression δ, thereby producing in the MEM structure a controllable micromotion amplifier.

Figure 4:
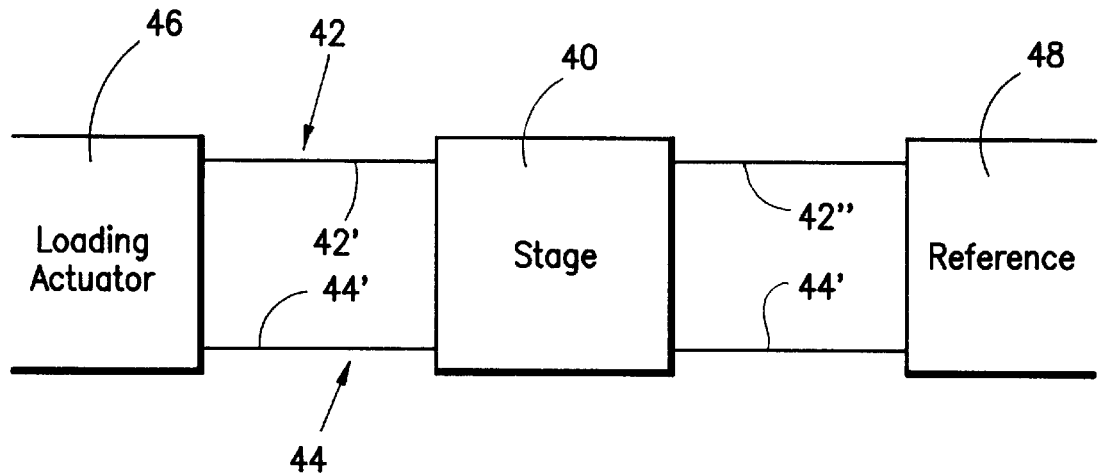
FIGS. 4, 5 and 6 illustrate in diagrammatic form the transverse buckling response of two parallel beams supporting a stage in response to an axial compressive force.
Figure 5:
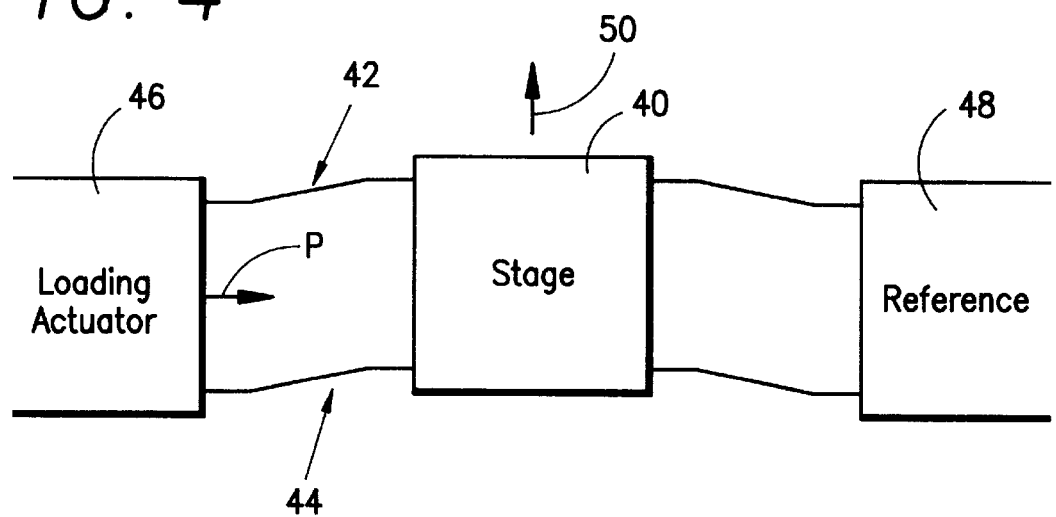
Figure 6:
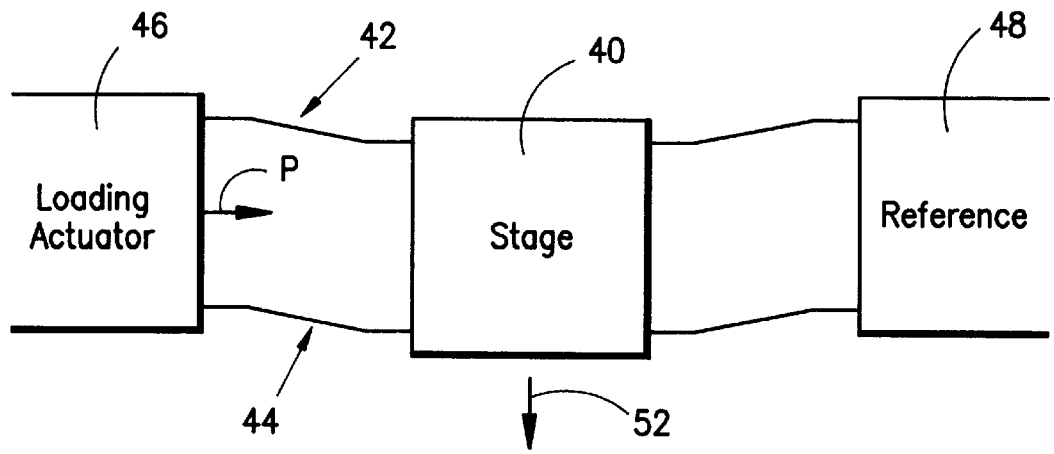

An application of the foregoing principle is illustrated in FIGS. 4, 5 and 6, wherein an object to be moved, such as a stage 40, is mounted at the midpoint of two parallel, transversely flexible beams 42 and 44 each connected at one end to a loading, or drive actuator 46, and at the opposite end to a fixed reference 48. The drive actuator 46 may be a comb-type drive capacitor such as that illustrated at 24 in FIG. 1, while the fixed reference 48 may be the wall of a cavity in a substrate, as illustrated at 16 in FIG. 1. Beam 42 may be a single flexible beam carrying the stage 40 at its center or may be a pair of flexible beam sections 42' and 42" connected between the actuator 46 and stage 40 and between the fixed reference 48 and stage 40, respectively. Similarly, beam 44 may be a single flexible beam carrying the stage or may be a pair of flexible beams 44' and 44". As illustrated in FIGS. 5 and 6, application of an axial force P in a direction parallel to the axes of beams 42 and 44 results in flexible buckling of the support beams 42 and 44 (or beams 42', 42" and 44', 44") in transverse directions 50 (FIG. 5) or 52 (FIG. 6) to provide controllable amplified transverse motion of the stage in response to axial compressive motion.

The buckling of beams 42 and 44 provides significant motion in the transverse direction Δ without fracturing of the beams. It has been found that transverse motion on the order of 100 micrometers is attainable for a beam length of 5 millimeters in response to an actuator motion δ on the order 5 micrometers without fracturing of the beam and with the stage returning to its original position upon release of the force P. This permits highly controllable and repeatable positioning of the stage 40 in response to a controlled force P as a function of the drive voltage applied to the actuator 24. The beam does not fracture because the buckling force $P_{cr}$ for long slender beams is much smaller than the fracture stress.

It should be noted that motion of the capacitive actuator 24 or 46 in response to the application of a voltage produces a corresponding change in the capacitance of the actuator, which can be measured as a function of the distance δ. Since the relationship between the distance δ and the distance Δ is known, measurement of the capacitance of actuator 24 can be used as an accurate measure of the transverse motion Δ of the stage 40. This, in turn, permits adjustment of the voltage applied to the actuator through suitable feedback controls to allow accurate regulation of the transverse motion and thus of the position of the stage 40.

The transverse buckling for controlled mechanical amplification is not limited to flexible MEM beams of the type discussed above. A similar operation can be obtained with segmented rigid MEM beams such as the beam generally illustrated at 60 in FIG. 7. The segmented beam may be made up of two rigid struts 62 and 64 connected in end-to-end relationship along a common axis 66 by a flexible connector 68. Such a connector may be a spring, as diagrammatically illustrated at 68, which interconnects the inner, or facing ends 70 and 72 of struts 62 and 64, respectively. The outer ends 74 and 76 of struts 62 and 64, respectively, are connected to respective surfaces 78 and 80 by respective flexible connectors such as springs diagrammatically illustrated at 82 and 84.

Figure 8:
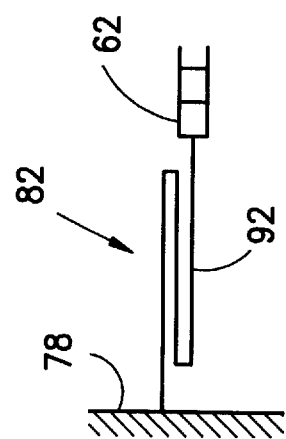
FIG. 8 is an enlarged view of a typical spring hinge.

In a preferred form of the invention, each of the rigid struts 62 and 64 is fabricated from a pair of parallel MEM beams, such as the beam 10 previously described, with the parallel beams being interconnected by cross bars to provide lateral as well as vertical rigidity. Such a rigid double-beam structure is described, for example, in U.S. patent application Ser. No. 08/067,264 of Kevin A. Shaw, et al., filed May 26, 1993 (attorney's Docket CRF D-1438), now U.S. Pat. No. 5,563,343. Thus, strut 62 is made up of parallel MEM beams 86 and 88 interconnected by a multiplicity of spaced, parallel cross beams 90. Strut 64 is similarly constructed. The springs 68, 82 and 84 are also flexible MEM structures and, as illustrated in the enlarged view of FIG. 8, may consist of a single folded or sinuous flexible MEM beam 92 connected at one end to the surface 78 and connected at its opposite end to strut 62. The spring 92 thus is connected at one end to surface 78, extends axially away from the surface toward strut 62, is folded back on itself to extend toward the surface 78, and is folded back on itself a second time to extend to its connection with strut 62. This spring may be similar to beam 10 in that it has a high aspect ratio, i.e., it is narrow so as to be flexible in a direction transverse to the axis of the struts 62 and 64, and has a relatively large depth for rigidity in a direction perpendicular to the plane of transverse motion. The springs 68 and 84 are similarly constructed, interconnecting the struts 62 and 64 with each other and interconnecting strut 64 with surface 80, as already described.

As previously noted, either the mounting surface 78 or the mounting surface 80, or both, can be a movable actuator such as the comb-type capacitive actuator described above. To simplify the description, it will be assumed that surface 78 is an actuator and that surface 80 is a fixed reference.

Figure 7:
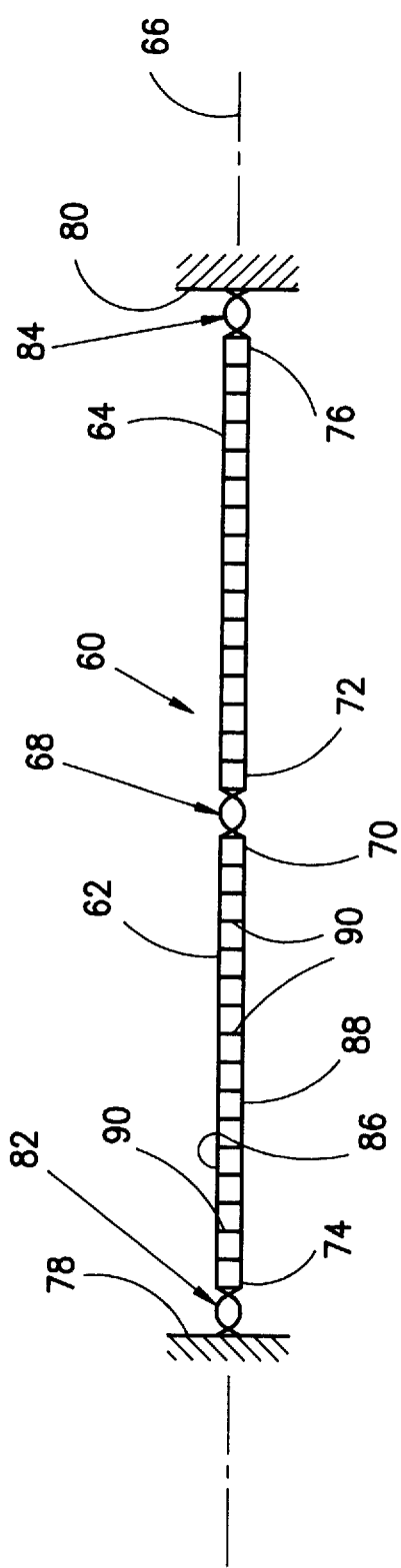
FIG. 7 illustrates in diagrammatic form a segmented beam wherein two rigid axially aligned struts are connected to each other and to an axial actuator by spring hinges.
Figure 9:
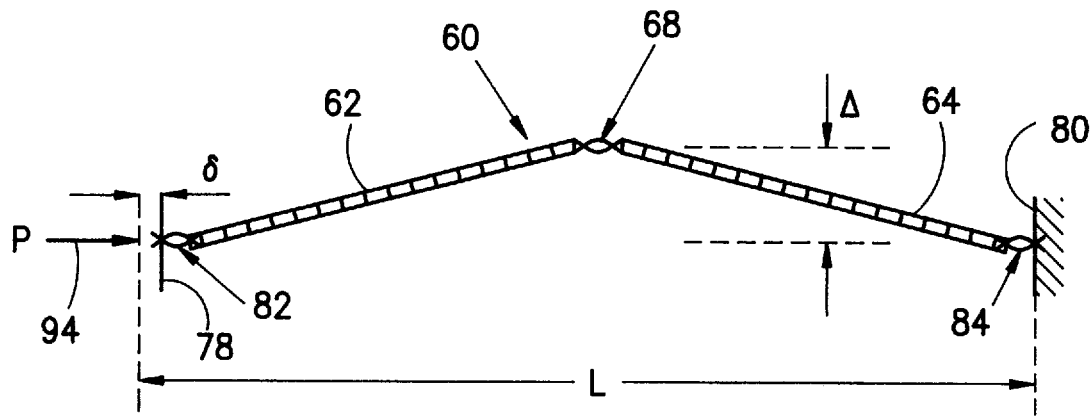
FIGS. 9 and 10 illustrate in diagrammatic form the transverse buckling response of the segmented beam of FIG. 7 upon application of an axial compressive force.
Figure 10:
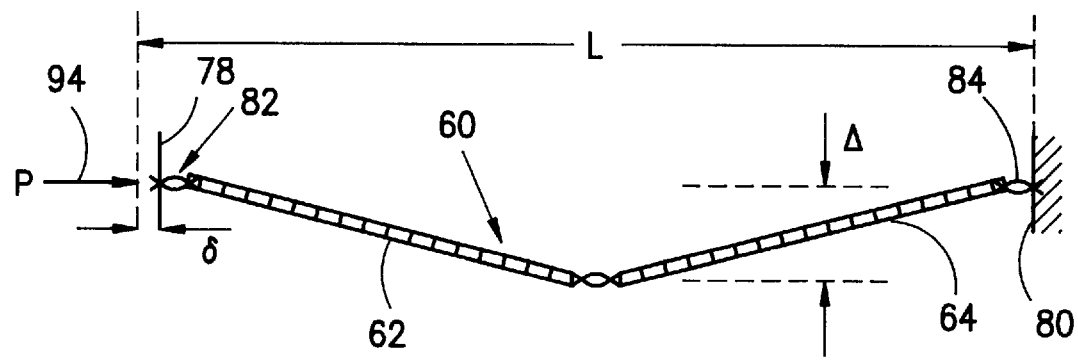

FIGS. 9 and 10 illustrate the buckling micromotion amplification which occurs, in accordance with the present invention, when actuator 78 applies an axial force to the segmented rigid beam 60 of FIG. 7. As there illustrated, motion of surface 78 an axial distance δ in response to an actuator force P, indicated by arrow 94, results in a buckling of the beam 60 at the central spring 68 and at end springs 82 and 84. This causes the center of the beam to deflect a distance Δ either in the upward direction as illustrated in FIG. 9 or in the downward direction as illustrated in FIG. 10. The spring constant of each of springs 68, 82 and 84 is low so that each spring provides minimal resistance against pivoting in the plane of the desired transverse motion of the beam, which is the plane of the drawing in FIGS. 7–10. The low resistance of the springs causes them to pivot in the manner of a hinge so that when an axial compressive load is applied at the ends of the strut-spring system of FIG. 7, it will buckle in the manner shown in FIGS. 9 and 10. In the illustrated configuration, the peak transverse displacement of the system is as follows:

$$\Delta = 2\sqrt{L\delta} \qquad (\text{Eq. 4})$$

so that the Δ of the segmented rigid beam system is more than twice the Δ of a single flexible beam of the type illustrated in FIGS. 1–3.

Figure 11:
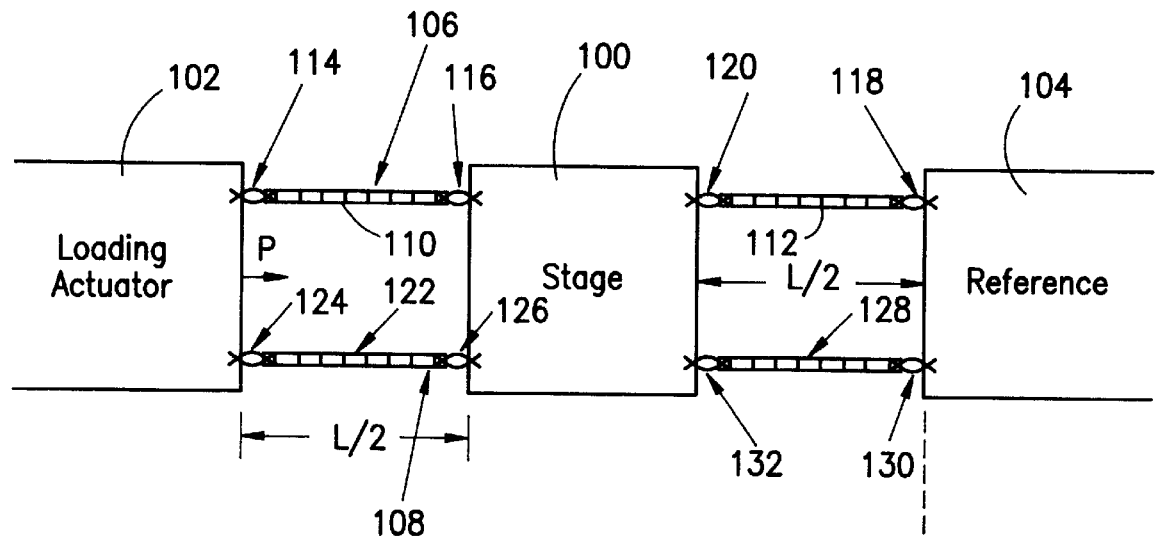
FIGS. 11, 12 and 13 illustrate the use of the segmented beam of FIG. 7 to support a central stage.

The segmented beam of FIG. 7 can be used to support an object such as a movable stage by positioning the stage between rigid strut segments in the manner illustrated in FIG. 11. Thus, a stage 100 is supported for transverse motion between a loading actuator 102 and a reference point 104 by rigid segmented beams 106 and 108. The beam 106 is made up of two rigid strut segments 110 and 112, with strut segment 110 being connected to actuator 102 by a spring 114 and to stage 100 by a spring 116. Similarly, strut segment 112 is connected to the reference point 104 by a spring 118 and is connected to stage 100 by a spring 120. Segmented beam 108 includes a first rigid strut segment 122 connected at one end to actuator 102 by a spring 124 and at its other end to stage 100 by a spring 126. The beam 108 also includes a rigid strut segment 128 connected between reference point 104 and stage 100 by springs 130 and 132, respectively.

Figure 12:
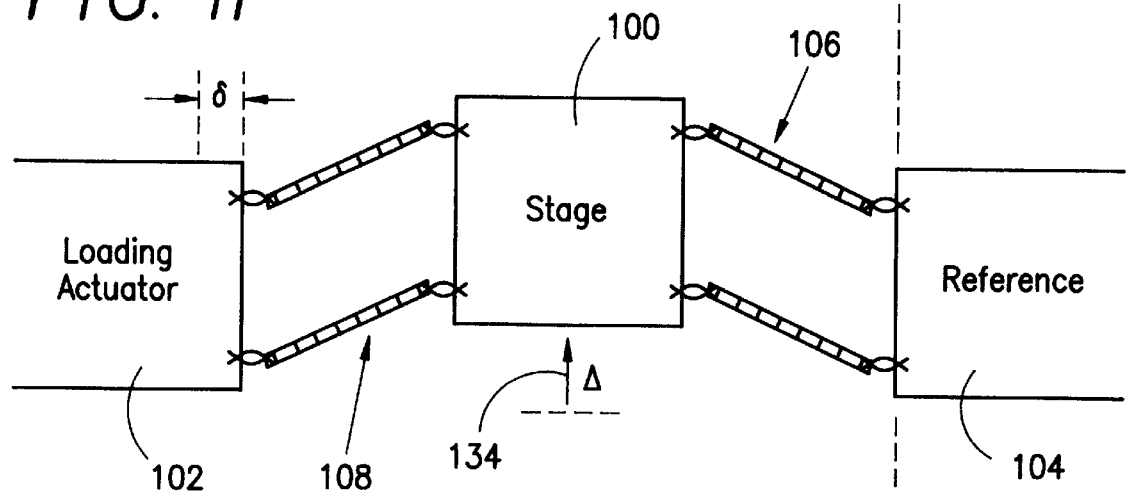
Figure 13:
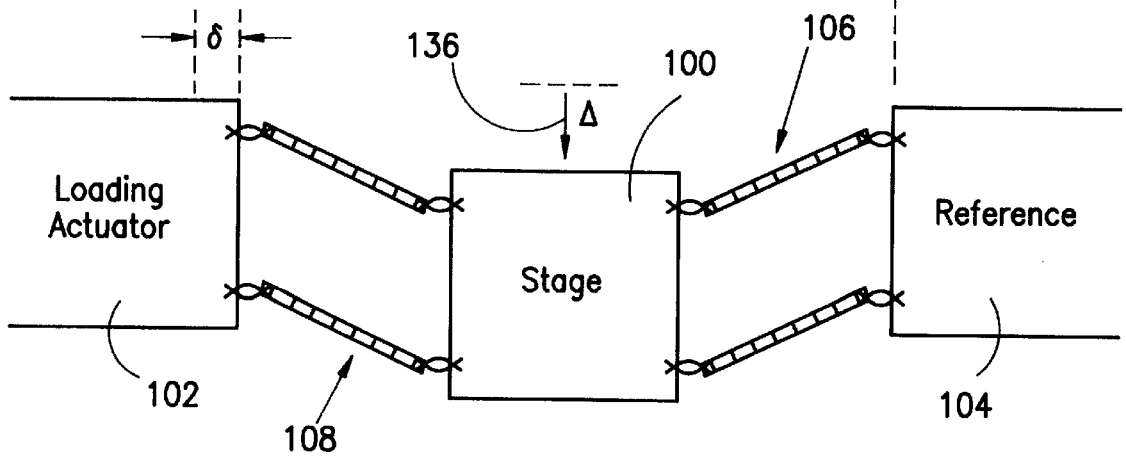

The application of a compressive axial load P by the actuator 102 in a direction parallel to the axes of segmented beams 106 and 108 causes each of the springs interconnecting the struts to stage 100, actuator 102 and reference 104 to flex in the manner illustrated in FIGS. 12 or 13. Thus, axial motion of the actuator by a distance δ produces the upward movement Δ indicated by arrow 134 in FIG. 12 or the downward movement Δ indicated by arrow 136 in FIG. 13. The peak transverse displacement Δ available in this configuration is defined by equation 4.

Figure 14:
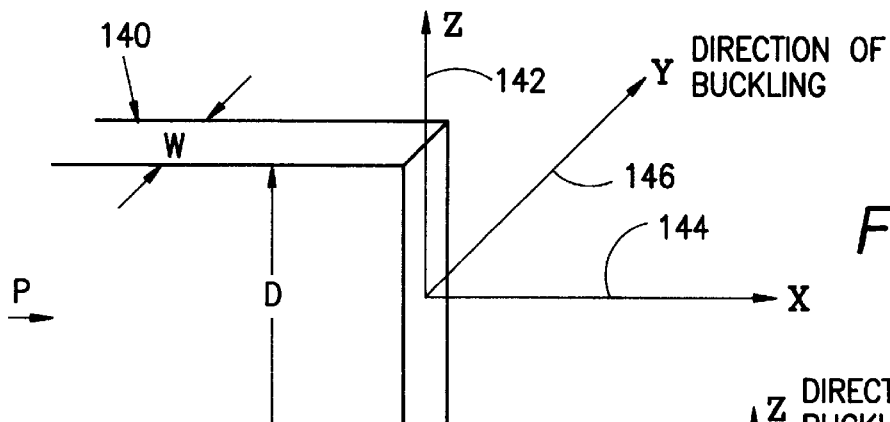
FIGS. 14 and 15 are diagrammatic illustrations showing the direction of buckling of a slender beam.
Figure 15:
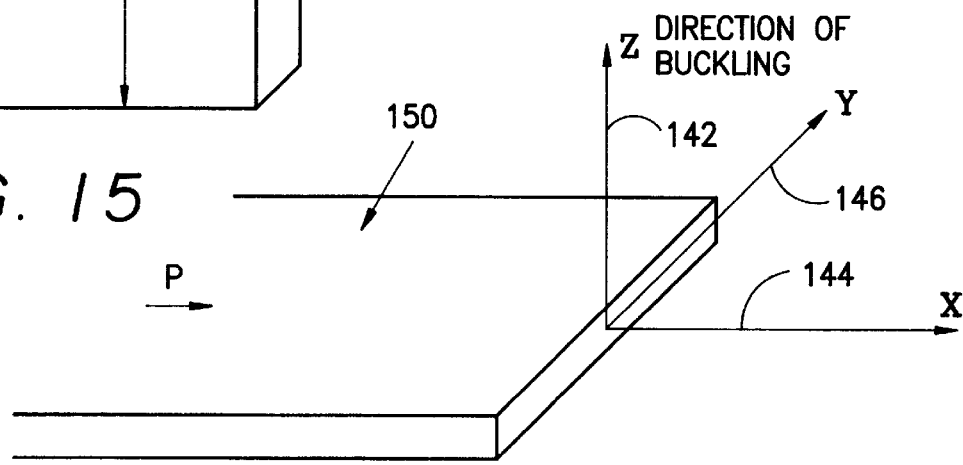

In order to ensure that buckling of a flexible beam occurs in a desired direction, the cross-section of the beam must be selected so that the moment of inertia I is minimum about the axis which is perpendicular to the desired direction of motion. Thus, for example, as illustrated in FIG. 14, a beam 140 having a width W and a depth D is oriented so that its depth dimension is parallel to the vertical, or Z axis 142, whereby the minimum moment of inertia I occurs about the axis 142. As a result, a force P applied along the axis X, indicated by line 144 in FIG. 14, will cause the beam to buckle transversely, in the direction of the Y axis 146. On the other hand, as illustrated in FIG. 15 a beam 150 oriented 90° from the beam 140 of FIG. 14 has its depth dimension parallel to the Y axis 146 so that a force applied along the X axis 144 will produce buckling in the direction of the Z axis 142. Thus, by proper orientation of the beam, the buckling motion Δ can occur along a selected axis so that motion in three dimensions is available.

In the foregoing discussion, it has been assumed that the beams or struts are symmetrical so that the buckling motion can occur in either an upward or downward direction, as viewed in the figures. However, the beams can be designed to be asymmetric, as by introduction of a perturbation in the beam so as to cause the beams to buckle in a selected direction. Such a perturbation is illustrated at ε in FIG. 16A, where beam 160 is shaped to have a predetermined bend 162 in its central portion between actuator 164 and reference 166. The perturbation ε predisposes the beam 162 to flex upwardly in the direction of arrow 168 upon the application of an axial force P.

Figure 16A:
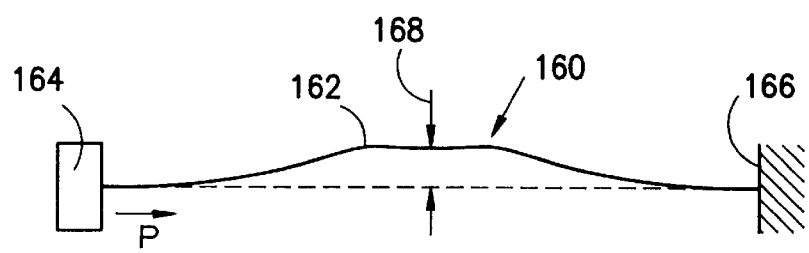
FIGS. 16A, 16B and 16C illustrate perturbations introduced into the segmented beam of FIG. 7 to initiate buckling along a preferred direction.
Figure 16B:
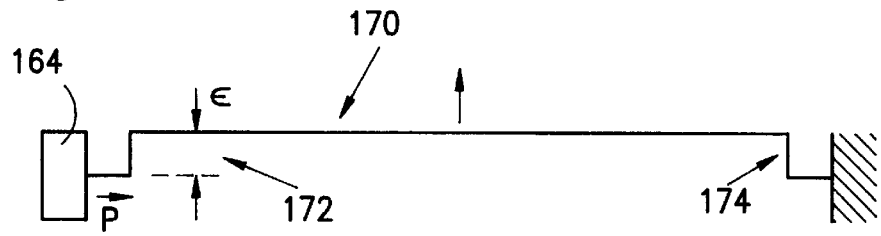
Figure 16C:
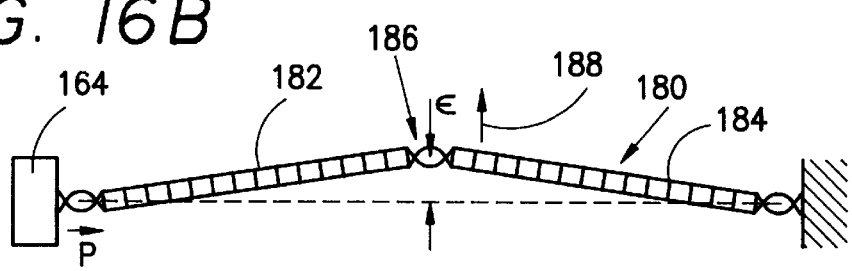

FIG. 16B illustrates a different perturbation ε for a beam 170, this perturbation being formed by steps, or shoulders 172 and 174 at opposite ends of the beam rather than the gradual perturbation illustrated in FIG. 16A. In FIG. 16C, a rigid segmented beam 180, having segments 182 and 184 connected by a spring 186 in the manner described with respect to FIG. 7, may be provided with a perturbation ε at its center; i.e., at the location of spring 186. Again, this perturbation provides a predetermined bend in the beam 180 so that the beam is predisposed to buckle upwardly in the direction of arrow 188 upon application of an axial force P. In each of the perturbations of FIGS. 16A, 16B and 16C, the beams buckle upwardly gradually as the axial force P is applied, since buckling in this direction is energetically more favorable. Thus, as the applied force P approaches the buckling load $P_{cr}$, a large transverse deformation Δ of the asymmetric beam is produced with a small change δ in the location of the drive actuator 164.

Figure 17:
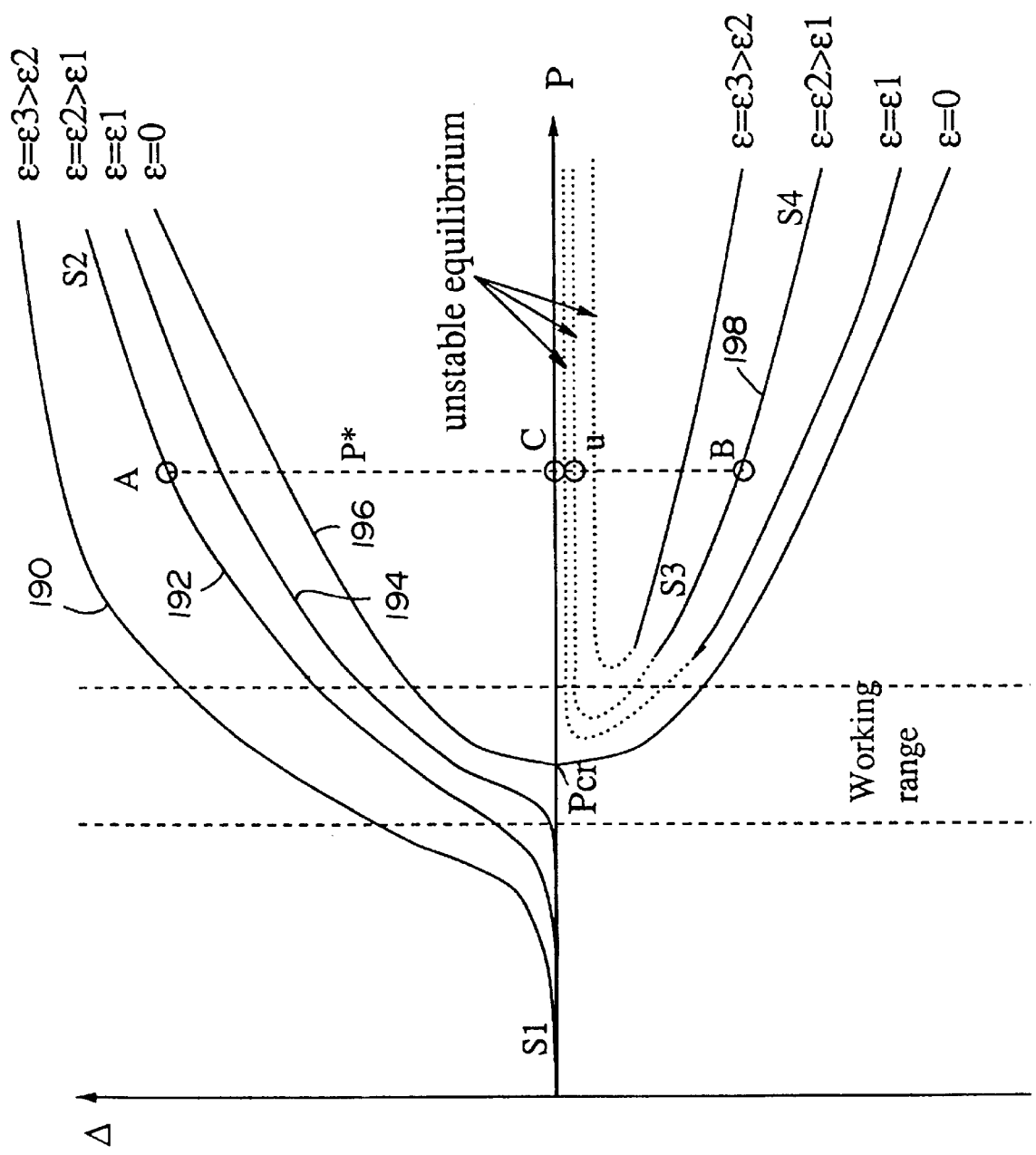
FIG. 17 is a graph illustrating qualitative deformation versus load for a beam.
Figure 18:
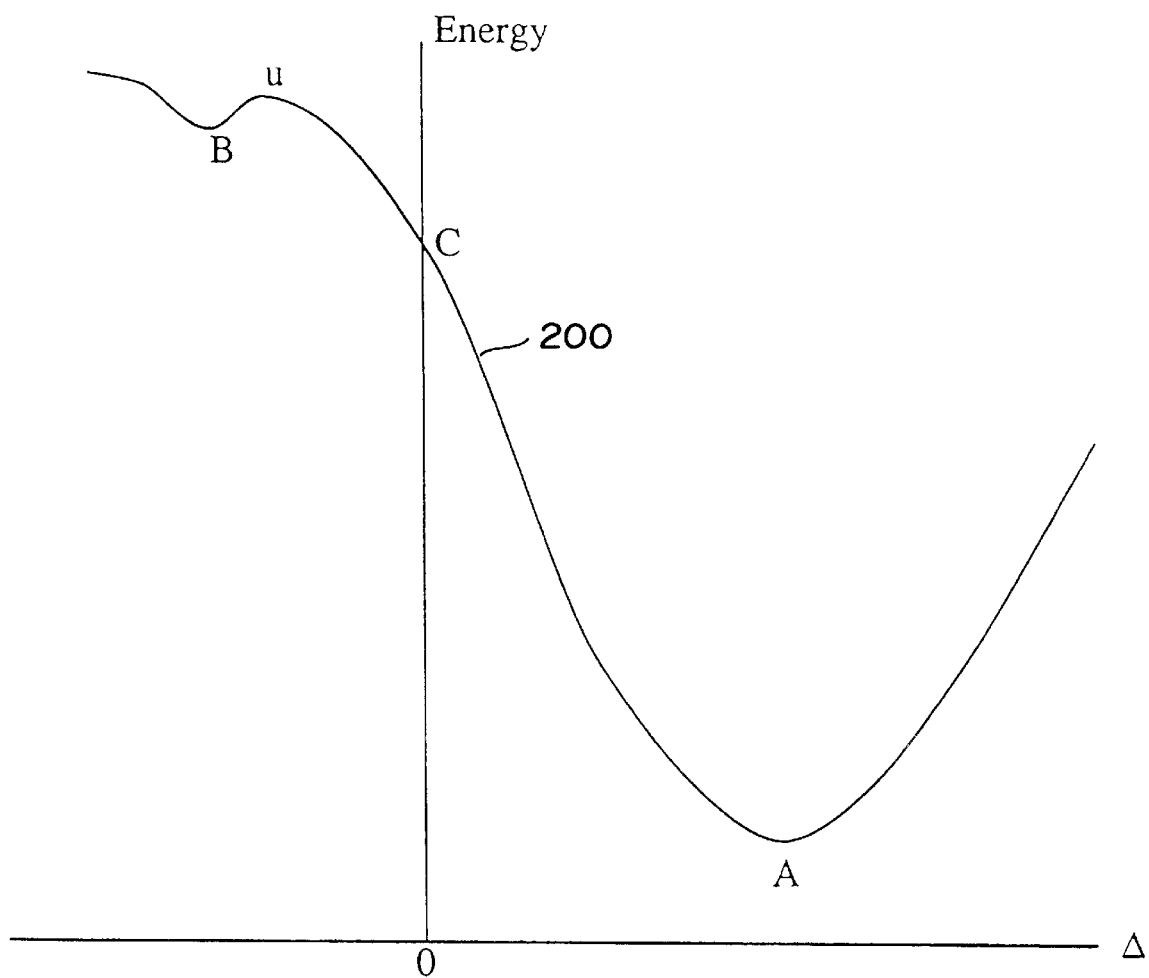
FIG. 18 is graphical illustration of the potential barrier to buckling of a beam.

FIG. 17 illustrates in diagrammatic form the relationship between the deformation Δ and the applied force P. As the force P approaches the value $P_{cr}$, a given beam will deflect, for example along one of the curves 190, 192, 194 or 196. Curve 192 shows the gradual deformation obtained by a gradual increase of the load P for a particular flexible beam. As illustrated, however, where P exceeds the value of $P_{cr}$, the deformation Δ can be in either the positive or the negative direction, for example, along curve 198 instead of curve 192 with the beam bending downwardly. This can also happen for a beam that has been buckled upwardly by the force P exceeding $P_{cr}$, and then being bent downwardly by an external force. After removal of the external force, the beam would still be at a stable equilibrium but with a bent-down configuration. To obtain this bent-down configuration; for example, at point B on curve 198, from a configuration at point A on curve 192, requires an external force sufficient to overcome a large potential barrier such as that illustrated by curve 200 in FIG. 18. As there illustrated, to move from point A on curve 192 to point B on curve 198 requires the application of energy so that the beam shifts from the equilibrium state A to equilibrium state B, with the beam absorbing the energy indicated by the curve. At an intermediate point along the energy curve 200 there is an unstable region u from which the beam can deflect in either a positive or a negative direction. It should be noted in FIG. 17 that in the region $P_{cr}$ the rate of change of the transverse deformation Δ with the force P is very high and at this point the deformation is stable, with perturbation $\epsilon \geq 0$.

It is important to note that the force P required to buckle the beam can be generated by any conventional actuator. Such an actuator compresses the beam in an axial direction to cause it to buckle. As long as the applied force is smaller than the beam's buckling load, and as long as the beam has not started to buckle, the generated force is absorbed by the beam. As the force P on the beam approaches $P_{cr}$, and the beam, with initial perturbation $\epsilon \geq 0$, begins to buckle, the beam will absorb only a small portion of any additional generated force. However, any support springs for the actuator will begin to deform as the actuator moves, and thus the bending of the support beams will absorb a major part of any additional applied force. This prevents a sudden uncontrolled motion of the actuator so that the transverse deformation of the buckled beam is stable and gradual.

Figure 16D:
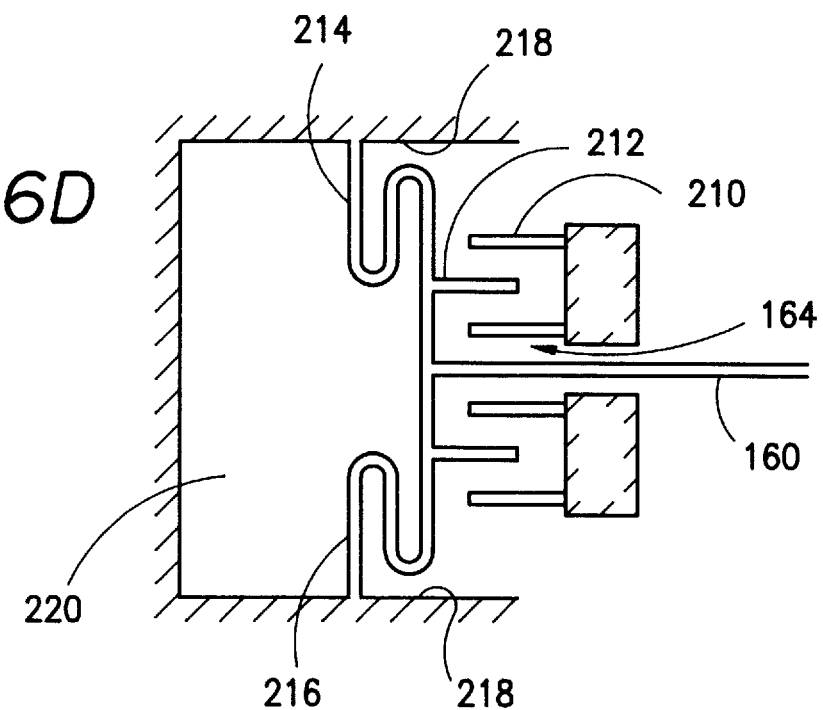
FIGS. 16D and 16E illustrate transverse spring supports for the actuator of FIGS. 16A–16C.
Figure 16E:
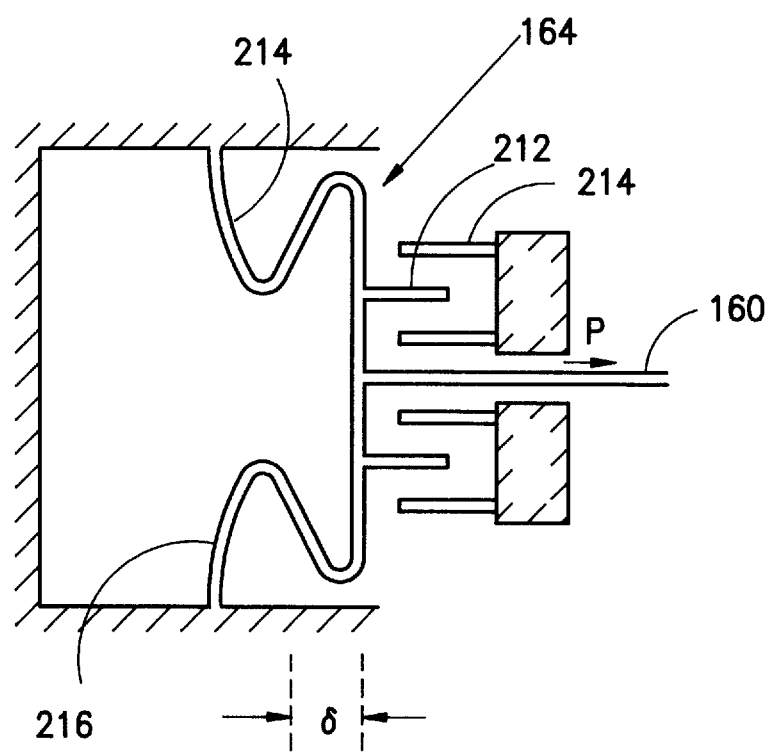

FIGS. 16D and 16E illustrate exemplary support springs for a comb-type actuator such as that illustrated at 164 in FIG. 16A. The actuator 164 includes a plurality of stationary capacitor fingers 210 interleaved with movable fingers 212, the movable fingers being fabricated as a part of flexible beam 160 (FIG. 16A) or fabricated as part of the spring hinges which connect segmented beam 180 (FIG. 16C) to the actuator. In order to stabilize the motion of the actuator and the end of the beam along the beam axis, a pair of lateral support springs 214 and 216 may be provided, the springs extending from the actuator to a fixed reference such as the side wall 218 of a cavity 220 in which the movable beam is located, as described with respect to FIG. 1. The beam 160, the movable portion of actuator 164, and the springs 214 and 216 are released for movement with respect to the substrate in which the cavity is located, with the springs 214 and 216 holding the fingers 212 in alignment with, and equally spaced from, the fixed fingers 210. Upon application of a voltage between the fingers 210 and 212 to cause the actuator to produce an axial force P on the beam 160 and consequent motion of the actuator upon buckling of the beam, the springs 214 and 216 deform as illustrated in FIG. 16E. This deformation accommodates the actuator motion while retaining the actuator in axial alignment with the beam location. As described above, a part of the force generated by the actuator 164 is required to deform springs 214 and 216, and by careful design of the spring constants of these springs, the buckling of beam 160 and the consequent amplification of the axial motion δ into transverse motion Δ is smooth and controlled.

FIG. 19A illustrates a pair asymmetrical beams 230 and 232 supporting a movable stage 234, with the beams supporting the stage between a loading actuator 236 and a reference 238. The beams each include perturbations $\epsilon$, illustrated at 240 and 242 for beam 230, which cause the stage 234 to move upwardly as viewed in the figures, upon application of an axial force P. This motion results in a transverse buckling Δ illustrated at 244 in FIG. 19B, in the manner discussed above.

FIG. 20A illustrates a movable stage 250 supported between a loading actuator 252 and a reference 254 by four rigid strut members 256, 258 and 260, 262. Asymmetrical mounting of the stage 250 is obtained by means of flexible springs which offset the mounting struts from the axial center line 264 of the actuator 252. This offset introduces a perturbation in the structure which causes the stage to move upwardly, as illustrated in FIG. 20B by arrow 266, in response to an axial compressive force P. The offset mounting is obtained by securing the mounting springs to offset arms on the actuator 252 and on the reference 254, and by providing offset mounting arms on the stage 250. Thus, for example, loading actuator 252 includes a pair of mounting arms 268, 270 having upwardly turned mounting points 272 and 274, respectively, to which mounting springs 276 and 278, respectively, are secured. These springs are folded or serpentine, with spring 276, for example, including a first segment 280 extending from mounting point 272 toward the actuator 252 and having a second segment 282 which is folded back on the first segment and which extends to a connection point at one end of the strut 256. Spring 278 is similarly mounted on actuator 252 and struts 258 and 262 are similarly mounted on the reference 254 by folded springs 284 and 286, respectively.

Stage 250 includes a generally T-shaped mounting arm 288 to which is connected a folded mounting spring 290 for connecting a second end of strut 256 to the stage and a folded spring 292 for connecting strut 258 to the stage. In similar manner, struts 260 and 262 are secured to the stage by folded springs 294 and 296. These folded springs provide a flexible connection so that in response to an axial force applied by actuator 252, the mounting springs flex in the manner of hinges in the plane of transverse motion to cause the struts 256, 258, 260 and 262 and their attached springs to buckle upwardly to move the stage 250 the distance Δ in a direction transverse to the axis 264.

Figure 21:
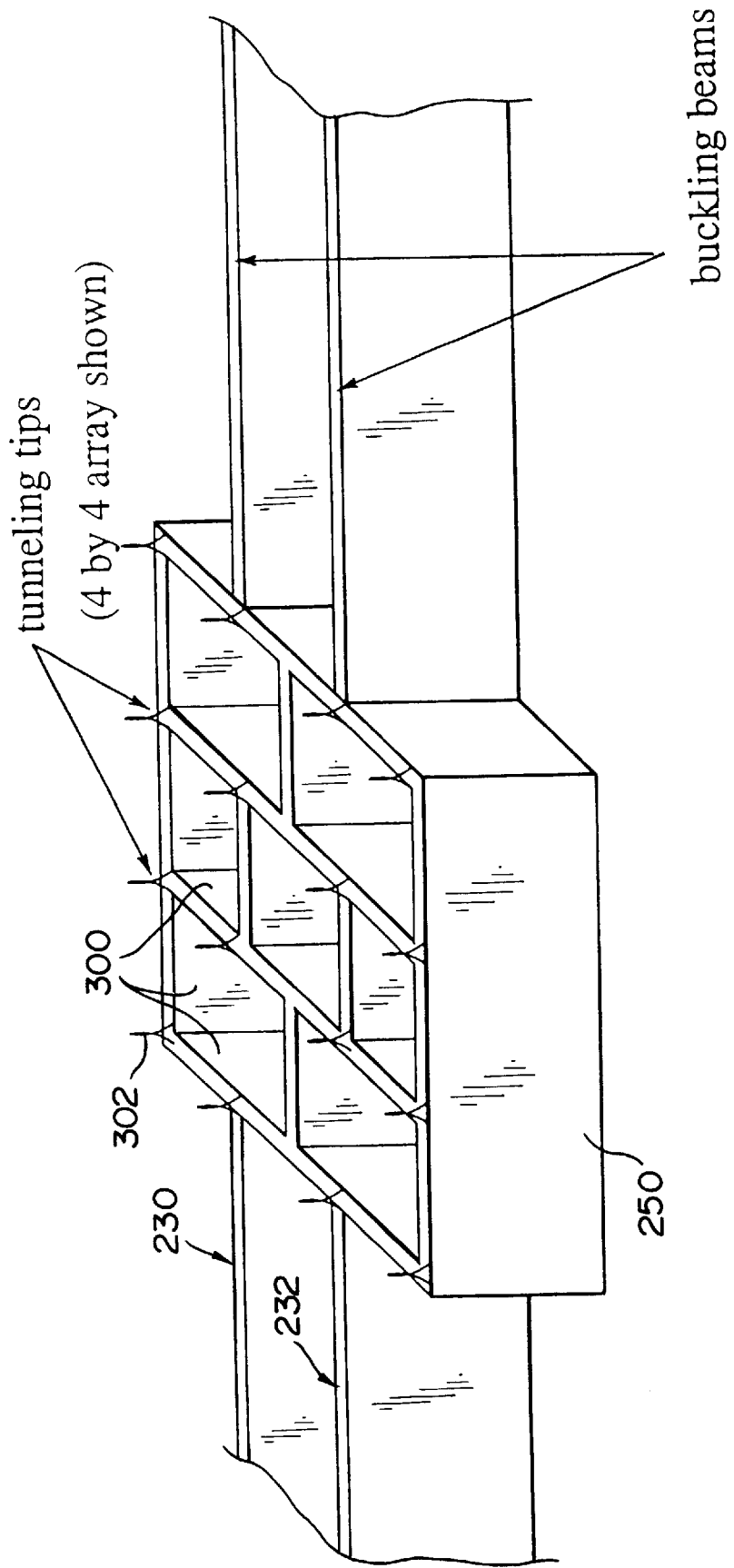
FIG. 21 illustrates in diagrammatic form a stage carrying a plurality of emitter tips.

The stage 250, as well as the stages illustrated in preceding figures, may take a variety of forms, but as illustrated in FIG. 21, in one preferred form the stage is fabricated from a plurality of beam sections 300 to form a grid, with a plurality of tunneling tips, emitting tips, or the like, indicated at 302 mounted on the top surface of the stage. The stage may be supported, for example, by flexible beams such as the beams 230 and 232 illustrated in FIG. 19A, with the entire device being fabricated by the SCREAM process described above.

Figure 22:
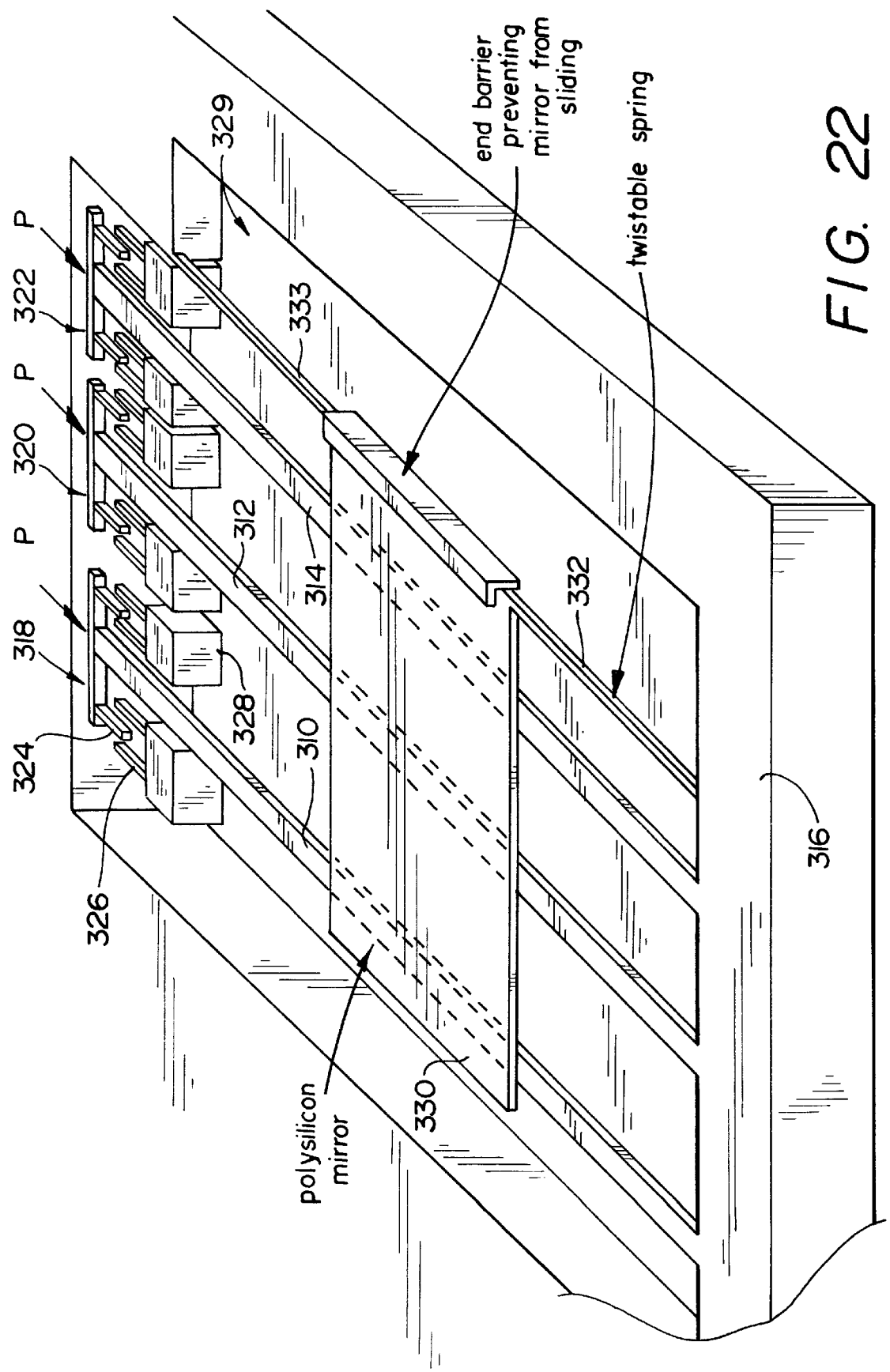
FIGS. 22 and 23 illustrate in diagrammatic form a mirror supported by plural long slender beams and the motion of the mirror in response to buckling of selected beams.

An application of the micromotion amplifier of the present invention is illustrated in FIG. 22 wherein three flexible beams 310, 312, and 314 are connected in parallel between a reference, or stationary support 316 and corresponding movable actuators 318, 320 and 322. The actuators may be comb-type capacitors having movable and fixed interleaved fingers such as the movable fingers 324 and the fixed fingers 326 of actuator 318. The fixed fingers may be mounted on supports 328 on the floor of a cavity 329 in the fixed substrate, which may include the fixed reference 316, so that a voltage applied between the fixed and movable fingers of a selected actuator will produce an axial force P upon the corresponding flexible beam. The beams 310, 312, and 314 are oriented to flex in an upward direction, as viewed in FIG. 22 and as illustrated for beam 312 in FIG. 23, with each beam being separately movable under the control of its respective actuator.

A micromirror 330, which may be fabricated from a polysilicon layer, is secured at one of its ends to a pair of torsion bars 332 and 333 which extend between the mirror and the adjacent fixed substrate region 316. The bars mount the mirror for pivotal motion, with the mirror lying on, but not attached to, the three flexible beams 310, 312, and 314. The bars 332 and 333 allow the mirror to pivot upwardly when any one of the beams 310, 312, and 314 is activated to buckle upwardly in the manner illustrated in FIG. 23 for beam 312. Thus, the buckling of a selected flexible beam causes the mirror 330 to pivot about torsional springs 332, 333, with the degree of tilt of the mirror about the torsional spring being dependent upon which beam is activated and upon the amplitude of the force P applied to that beam. The tilt angle of the mirror is small when beam 310 is buckled, and is large when beam 314 is tilted, with the three beams being selectable to provide a high degree of precision for the tilting of the mirror. The micromirror 330 may be used to reflect laser light, or the like, for scanning or other known uses.

Figure 23:
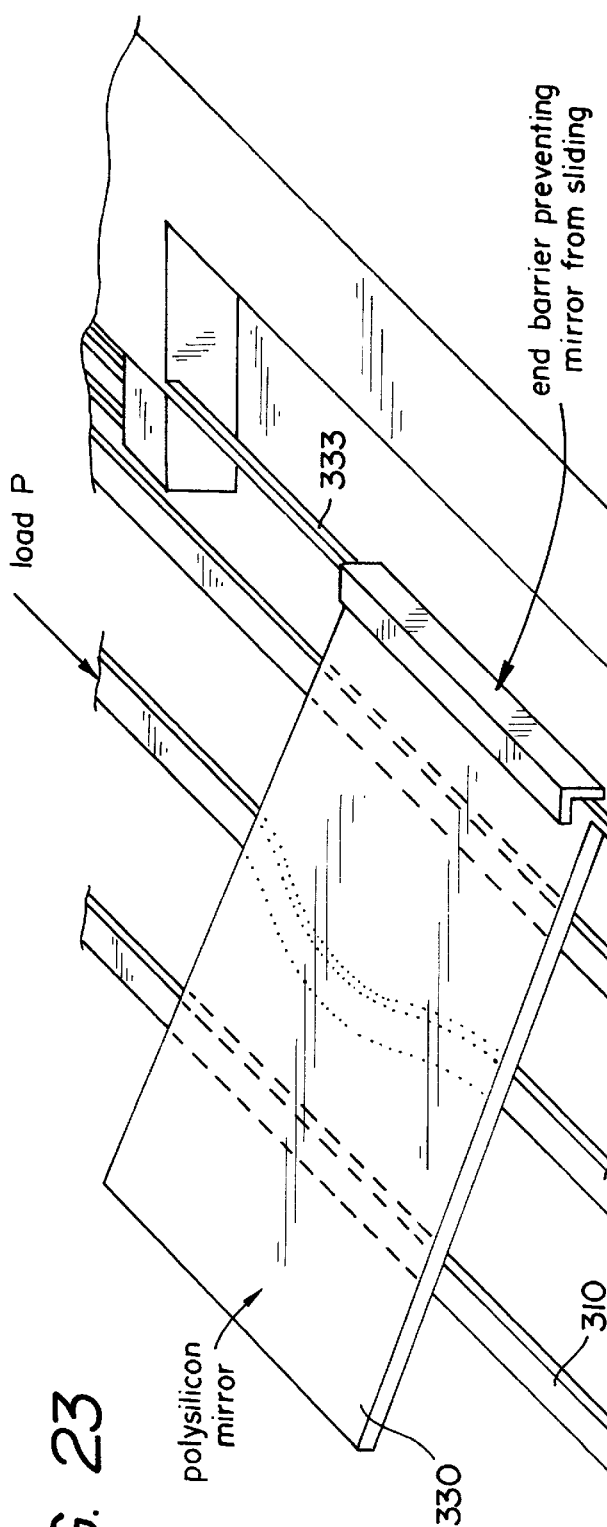
Figure 24:
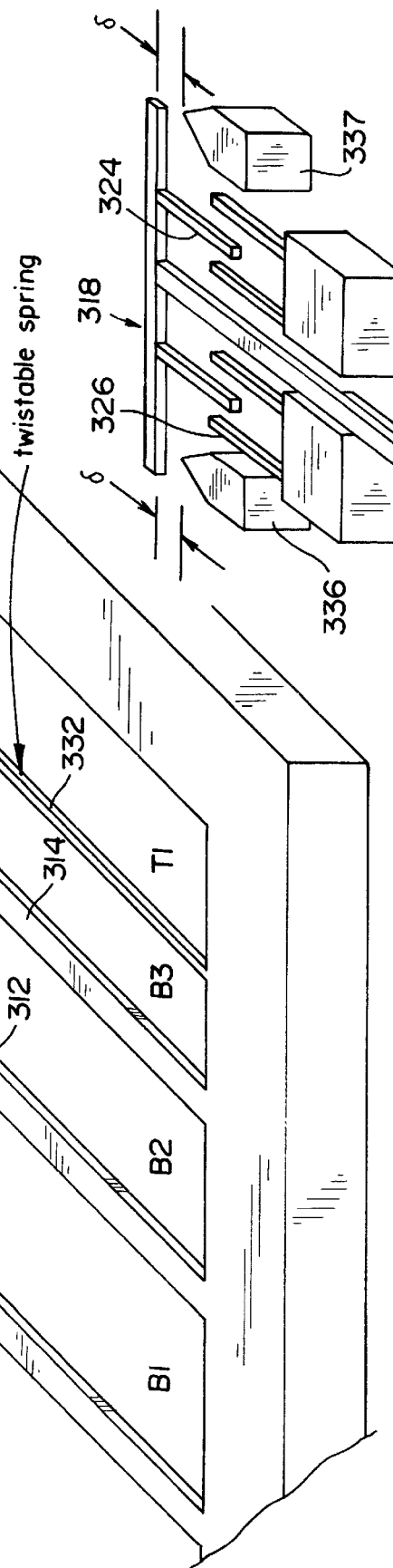
FIG. 24 illustrates the use of stops to regulate beam motion, resulting in digital motion.

The beams 310, 312 and 314 are continuously variable in the device illustrated in FIGS. 22 and 23 to provide continuous, or analog, control of mirror location under the control of the actuators. A digital control of the mirror position can be obtained by providing positive stops for the actuators, as illustrated by stops 336 and 337 for actuator 318 in FIG. 24. Similar stops can be provided for each of the other beams 312 and 314 to engage the respective actuators 320 and 322, so that these selectable tilt positions are provided. This arrangement precisely positions the mirror in a predetermined position in response to energization of actuator to provide digital positioning.

Figure 25:
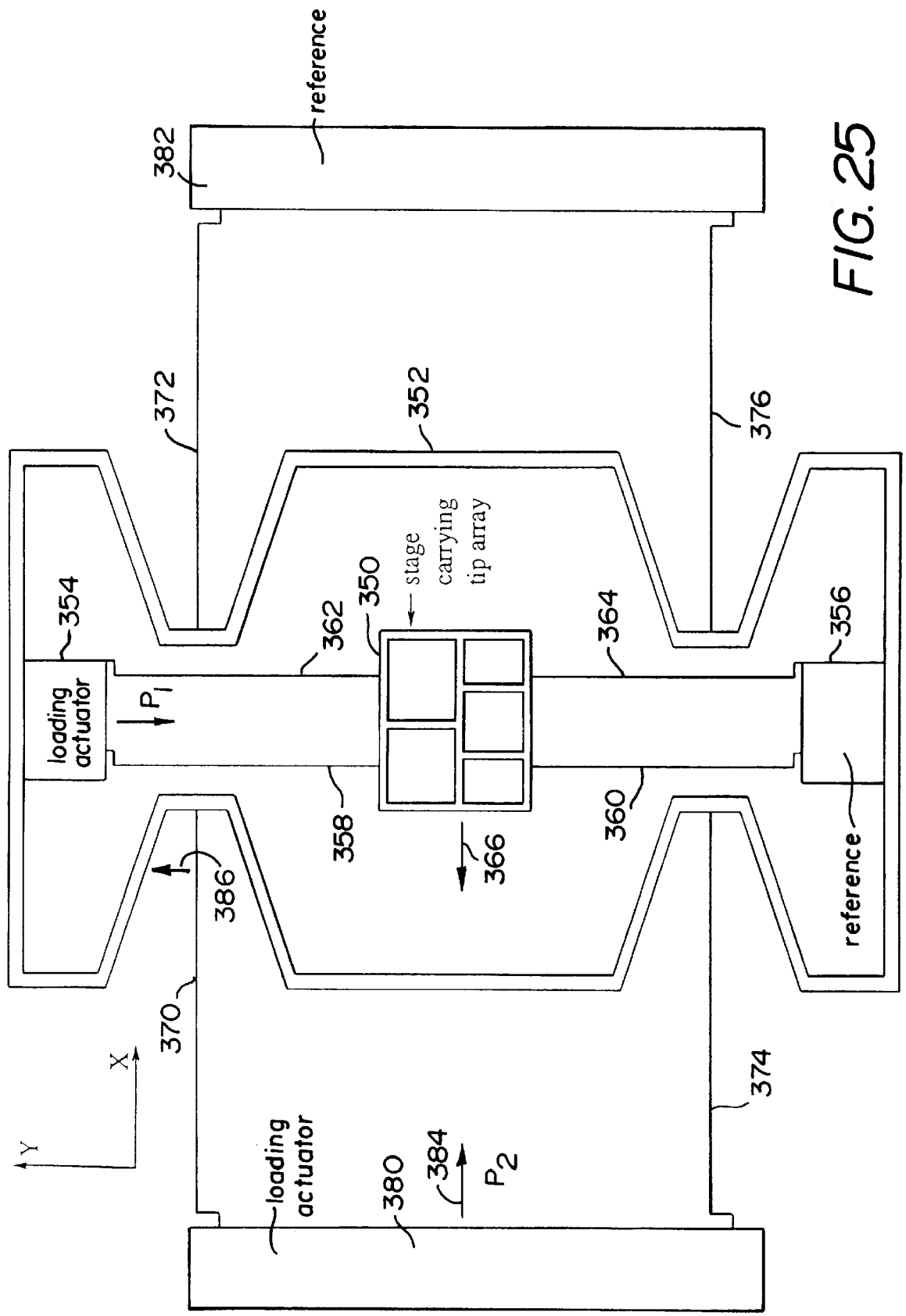
FIG. 25 illustrates in diagrammatic form a compound stage controlled by multiple buckling beams.

Two dimensional controlled motion of a central stage is obtained, in accordance with one embodiment of the invention, by mounting a central stage for motion within an intermediate stage, with the intermediate stage itself being mounted for relative motion with respect to a surrounding substrate. Such a stage within a stage arrangement permits selective motion in X and Y directions and is illustrated in FIG. 25 wherein a central stage 350 is mounted within an intermediate stage 352. As illustrated, stage 350 is mounted between a loading actuator 354 and a reference 356 by means of offset, or asymmetrical beams 358, 360 and 362, 364. Energization of actuator 354 to produce an axial force $P_1$ on flexible beams 358, 360 and 362, 364 causes the stage 350 to shift in the direction indicated by arrow 366, along an X axis. The actuator 354 and reference 356 are mounted on the intermediate stage 352 which is, in turn, supported by asymmetrical flexible beams 370, 372 and 374, 376 between a loading actuator 380 and a reference 382. Energization of actuator 380 to produce an axial force P in a direction indicated by arrow 384 causes the beams 370, 372 and 374, 376 to buckle upwardly in the direction indicated by arrow 386 along a Y axis to cause stage 352 and its included stage 350 to move along the Y axis. Thus, by selective energization of the actuators 354 and 380, X and Y motion of the stage 350 can be accomplished.

Although in each of the embodiments described above, one end of the flexible beams or segmented rigid beams has been illustrated as being connected to an actuator, it will be understood that in any of these cases the opposite end of the beam can be so connected or, if desired, both ends of the beams can be connected to actuators for selective buckling of the respective beams. Various other modifications will be apparent to those of skill in the art. Thus, although the invention has been described in terms of preferred embodiments, it will be apparent that variations and modifications may be made without departing from the true spirit and scope thereof, as set forth in the accompanying claims.

What is claimed is:

1. A micromotion amplifier, comprising:
    an elongated microelectromechanical beam having a first end, a second end, and a longitudinal axis;
    a reference;
    said first end of said beam being connected to said reference;
    an actuator energizable for motion with respect to said reference; and
    said actuator being connected to said second end of said beam so that energization of said actuator tends to move said actuator along said longitudinal axis to apply an axial force to said beam and to produce resultant transverse buckling of said beam to thereby convert axial motion of said actuator to amplified transverse motion of said beam in a plane of motion.

2. The amplifier of claim 1, wherein said beam is flexible.

3. The amplifier of claim 2, wherein said beam is asymmetric.

4. The amplifier of claim 1, wherein said beam comprises multiple coaxial rigid segments connected to each other, to said actuator and to said reference by corresponding flexible springs.

5. The amplifier of claim 4, wherein said segments are asymmetric.

6. The amplifier of claim 4, wherein said flexible springs comprise folded beams for controlled motion of said beam in said plane of motion.

7. The amplifier of claim 1, wherein said reference is fixed.

8. The amplifier of claim 1, wherein said reference is movable axially with respect to said beam.

9. The amplifier of claim 1, wherein said reference comprises an intermediate stage mounted for motion with respect to a second reference.

10. The amplifier of claim 1, further including a stage centrally mounted on said beam for controlled transverse motion in response to said axial force.

11. The amplifier of claim 1, wherein said reference comprises an intermediate stage mounted by buckling beams to a second reference for relative motion with respect to said second reference along an X axis, and further including:
    a central stage mounted by buckling beams to said intermediate stage for relative motion with respect to said intermediate stage along a Y axis to produce a stage within a stage and controlled motion along X and Y axes.

12. A micromotion amplifier, comprising:
    first and second parallel, elongated microelectromechanical beams each having a first end, a second end, and a longitudinal axis;
    a reference, said first ends of said beams being connected to said reference;
    a stage supported by said beams;
    an actuator energizable for motion with respect to said reference, said actuator being connected to said second ends of said beams so that energization of said actuator tends to move said actuator in a direction parallel to the longitudinal axes of said beams to apply an axial force to said beams and to produce resultant transverse buckling of said beam to thereby convert axial motion of said actuator to amplified transverse motion of said beams and controlled transverse motion of said stage in a plane of motion.

13. The amplifier of claim 12, wherein said beams are flexible.

14. The amplifier of claim 13, wherein said beams are asymmetrical.

15. The amplifier of claim 12, wherein each said beam comprises multiple rigid segments connected between said stage and said actuator and multiple rigid segments connected between said stage and said reference.

16. The amplifier of claim 15, wherein said beams are asymmetrically mounted to said actuator and to said reference.

17. The amplifier of claim 16, further including a stop to limit the motion of said actuator to thereby limit the transverse buckling of said beam, and digitizes the tilting of the mirror.

18. The amplifier of claim 17, further including a stop to limit the motion of said actuator to thereby limit the transverse buckling of said beam.

* * * * *

UNITED STATES PATENT AND TRADEMARK OFFICE
CERTIFICATE OF CORRECTION

PATENT NO. : 5,862,003
DATED : January 19, 1999
INVENTOR(S) : Saif, et al.

It is certified that error appears in the above-identified patent and that said Letters Patent is hereby corrected as shown below:

Column 12, lines 59-65:
 Rewrite patented claim 17 as follows:

-- 17 The amplifier of claim 1, further including a pivotally mounted mirror resting on said beam, whereby said transverse buckling pivots said mirror. --

Claim 18, line 3, after "beam" insert --, and digitize the tilting of the mirror --.

Signed and Sealed this

Third Day of August, 1999

Attest:

Q. TODD DICKINSON

Attesting Officer

Acting Commissioner of Patents and Trademarks